(12) United States Patent
Zhou et al.

(10) Patent No.: US 11,789,064 B1
(45) Date of Patent: Oct. 17, 2023

(54) DECOUPLING BTI AND HCI MECHANISM IN RING OSCILLATOR

(71) Applicant: International Business Machines Corporation, Armonk, NY (US)

(72) Inventors: Huimei Zhou, Albany, NY (US); Liqiao Qin, Albany, NY (US); Miaomiao Wang, Albany, NY (US); Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/852,181

(22) Filed: Jun. 28, 2022

(51) Int. Cl.
| | |
|---|---|
| *G01R 31/28* | (2006.01) |
| *G01R 31/26* | (2020.01) |
| *G01R 31/319* | (2006.01) |
| *H03K 3/03* | (2006.01) |
| *H01L 21/66* | (2006.01) |

(52) U.S. Cl.
CPC ..... *G01R 31/2824* (2013.01); *G01R 31/2607* (2013.01); *G01R 31/31924* (2013.01); *H01L 22/34* (2013.01); *H03K 3/0315* (2013.01)

(58) Field of Classification Search
CPC . H01L 22/34; G01R 31/2884; G01R 31/2642; G01R 31/2607; G01R 31/31924; H03K 3/0315
USPC ........ 324/762.02; 438/10; 326/9; 331/56, 57
See application file for complete search history.

(56) References Cited

U.S. PATENT DOCUMENTS

| | | | |
|---|---|---|---|
| 6,476,632 | B1 | 11/2002 | LaRosa et al. |
| 8,692,571 | B2 | 4/2014 | Lai et al. |
| 9,866,221 | B2 | 1/2018 | Jenkins et al. |
| 10,002,810 | B2 | 6/2018 | Jenkins et al. |
| 10,114,068 | B1 | 10/2018 | Chen et al. |
| 10,247,769 | B2 | 4/2019 | Linder et al. |

(Continued)

FOREIGN PATENT DOCUMENTS

WO    WO-2016026846 A1 *  2/2016  ......... G01R 31/2856

OTHER PUBLICATIONS

Keane, John, "An All-In-One Silicon Odometer for Separately Monitoring HCI, BTI, and TDDB", IEEE Journal of Solid-State Circuits, Apr. 2010, pp. 817-829, vol. 45, No. 4.

(Continued)

*Primary Examiner* — Arnold M Kinkead
(74) *Attorney, Agent, or Firm* — Scully, Scott, Murphy & Presser, P.C.; Matt Zehrer

(57) ABSTRACT

A ring oscillator circuit design includes three or more inverter stages connected in series. Each inverter stage includes one or more inverter devices including a PMOS device and a coupled NMOS device. The PMOS device in each of odd alternating inverter devices of the three or more inverter stages having a source terminal receiving power from a power rail conductor, and a source terminal of the coupled NMOS device in each of first alternating inverter devices is grounded. An output of a last inverter device of a last stage of the three or more inverter stages is connected to an input of a first inverter stage. The method measures a first frequency of a first ring oscillator circuit and measures a second frequency of a second ring oscillator circuit design to determine either a BTI or HCI failure mechanism of the first ring oscillator circuit based on the measurements.

18 Claims, 9 Drawing Sheets

(56) References Cited

U.S. PATENT DOCUMENTS

| | | |
|---|---|---|
| 10,746,781 B2 | 8/2020 | Bernstein |
| 2016/0223609 A1* | 8/2016 | Hwang .............. H03K 17/6872 |

OTHER PUBLICATIONS

Kim, et al., "Investigation of HCI effects in FinFET based Ring Oscillator Circuits and IP Blocks", 2017 IEEE International Reliability Physics Symposium (IRPS), Apr. 2017, pp. 1-4.

* cited by examiner

DECOUPLING BTI AND HCI MECHANISM IN RING OSCILLATOR

BACKGROUND

The present application relates to semiconductor technology, and more particularly to semiconductor circuits employing ring oscillator structures for decoupling Hot Carrier Injection (HCI) and Bias Temperature Instability (BTI) effects from ring oscillators.

As known, ring oscillators (RO) are typically used as prototype circuits, e.g., to test new semiconductor processes. They also allow to run the gates of any new process at an optimal speed, which is ideal to optimize the design parameters and layout rules for the new processes.

BTI effect is a phenomenon in which stress occurs during ON state of a MOSFET device, and its characteristics fluctuate with time. This fluctuation is caused by trapping and de-trapping of carriers into defects of gate oxide or interface. For example, if a carrier is captured in a defect, the voltage threshold (Vth) of a MOSFET is increased. The case of emission of carriers is vice versa. When a transistor turns on, the trapping becomes a dominant factor, resulting in performance degradation of the transistor.

HCI is a phenomenon in which high energy (hot) carrier are injected into the gate oxide of MOSFET and cause characteristic degradation of the transistor. The hot carrier is generated by acceleration due to the electric field between the drain and the source terminals, i.e., hot carriers are injected only when current flows between source and drain node and CMOS logic circuits thus exhibit have HCI during switching operation period. When a voltage input at an inverter changes from low to high or high to low. The deterioration due to HCI accumulates and increases as the number of switching operations increases.

SUMMARY

A ring oscillator circuit and RO test methodology for de-coupling Bias Temperature Instability (BTI) and Hot Carrier Injection (HCI) failure mechanisms.

A ring oscillator circuit design without any change in functionality to de-couple BTI and HCI failure mechanism.

In one aspect, there is provided a ring oscillator circuit. The ring oscillator circuit comprises three or more inverter stages connected in series, wherein each inverter stage includes one or more inverter devices, each inverter device comprising a PMOS FET device (PMOS) and a coupled NMOS FET device (NMOS), the PMOS device in each of first alternating inverter devices of the three or more inverter stages having a source terminal configured to one of: receive power from a power rail conductor or be grounded, and wherein a source terminal of the coupled NMOS device in each of first alternating inverter devices of the three or more inverter stages is grounded or at a relative different power level than the power level at the power rail conductor; and the PMOS device in each of the second alternating inverter devices of the three or more inverters having a source terminal that is one of: grounded or at the same or relative different power level than the power level of at the source terminal of each of first alternating inverter devices, and wherein a source terminal of a NMOS device in each of second alternating inverter devices of the three or more inverter stages is configured to one of: receive the same power or a relatively different power, or be grounded; and an output of a last inverter device of a last stage of the three or more inverter stages in series is connected to an input of a first inverter stage of the three or more inverter stages in series.

In another embodiment of the present application there is provided a ring oscillator circuit. The ring oscillator circuit comprises: three or more inverter stages connected in series, wherein each inverter stage includes one or more inverter devices, each inverter device comprising a PMOS FET device (PMOS) and a coupled NMOS FET device (NMOS), the PMOS device in each of first alternating inverter devices of the three or more inverter stages having a source terminal configured to receive power from a power rail conductor, and wherein a source terminal of the coupled NMOS device in each of first alternating inverter devices of the three or more inverter stages is grounded or at a relative different power level than the power level at the power rail conductor; an output of a last inverter device of a last stage of the three or more inverter stages in series is connected to an input of a first inverter stage of the three or more inverter stages in series; a first conductor line; a first switch operable for conducting the output of the last inverter device of the last stage of the three or more inverter stages to the first conductor line, wherein a source terminal of each PMOS device of each of second alternating inverter devices of the three or more inverter stages is connected to the first conductor line; a second conductor line; and a second switch operable for conducting the output of the last inverter device of the last stage of the three or more inverter stages to the second conductor line, wherein a source terminal of each NMOS device of each of second alternating inverter devices of the three of more inverter stages is connected to the second conductor line.

In a further aspect of the present invention, a method comprises: measuring a first frequency of a ring oscillator circuit of a first design; measuring a second frequency of a ring oscillator circuit of a second design; and determining a dominant failure mechanism of the first ring oscillator circuit based on the measured first frequency and the measured second frequency.

DETAILED DESCRIPTION

Figure 1A:
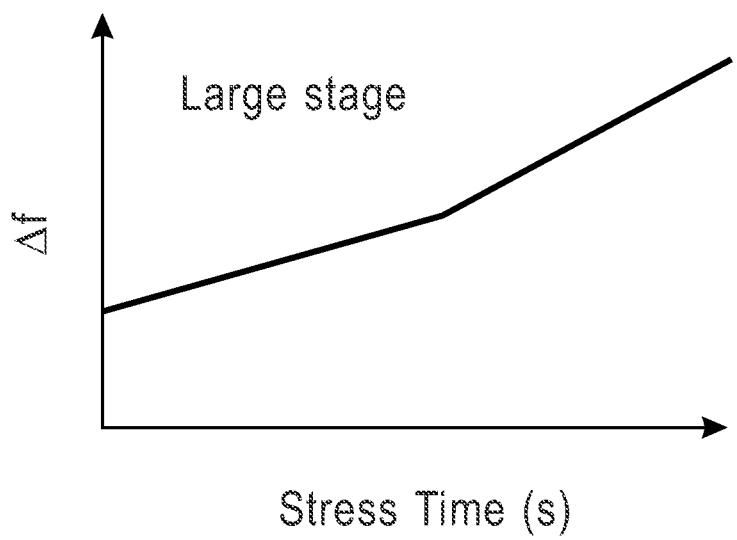
FIG. 1A is a plot depicting a frequency shift measured at an output of a conventional multi-stage ring oscillator circuit as a function of stress time in seconds in which BTI effects are more significant.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
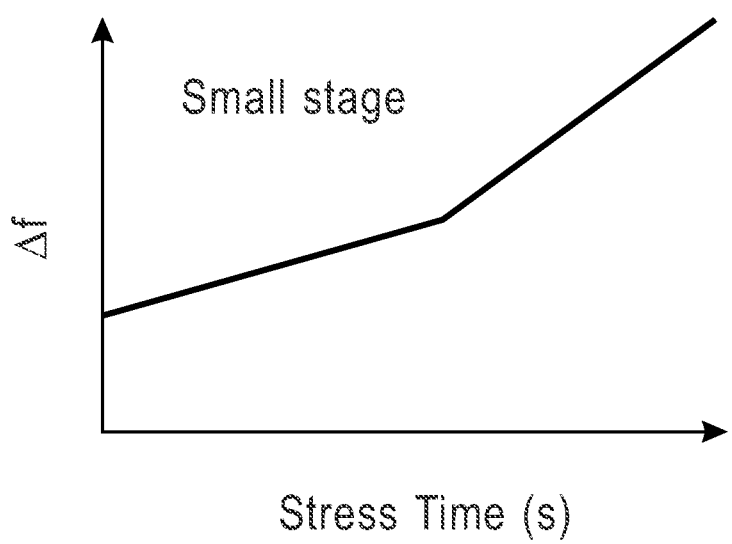
FIG. 1B is a plot depicting a frequency shift measured at an output of a conventional multi-stage ring oscillator circuit as a function of stress time in seconds in which HCI effects are more significant.
Figure 2:
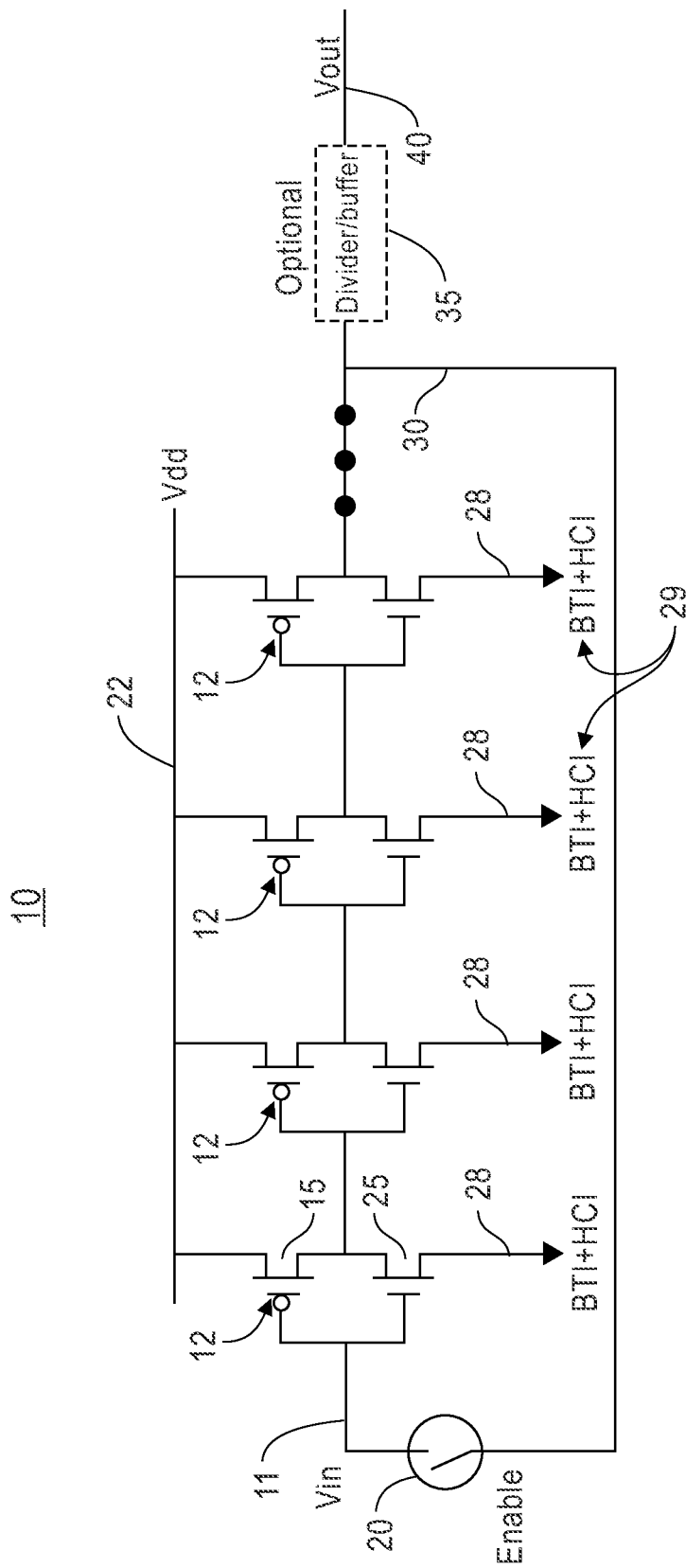
FIG. 2 depicts a conventional multi-inverter stage ring oscillator circuit in which it is difficult to discern BTI versus HCI failure effect mechanisms.

FIG. 2 depicts a standard ring oscillator circuit according to a conventional embodiment. As shown in FIG. 2, the ring oscillator (RO) circuit 10 includes a chain of serial connected inverter devices 12. The input to the RO circuit is a voltage input line 11 and the output stage is fed back via voltage feedback line 30 to the input line, e.g., through an enable switch 20. Vout is the oscillator output signal 40 that is a waveform oscillating between two voltage levels at a frequency determined by the delay of each inverter and the number of inverter stages. Each inverter stage 12 of the RO is a differential stage, including a connected PMOS FET 15 and NMOS FET device 25 having a common gate input receiving a voltage output produced from a prior stage and having a common connected drain terminal outputs. In the circuit 10 of FIG. 1, the source of PMOS device 15 at each inverter stage directly connects to a direct current (DC) power rail 22 for receiving a source voltage Vdd. The source terminal of each NMOS device 25 at each inverter stage is directly connected to a ground or negative voltage potential 28 or current sink. In the conventional design depicted in FIG. 2, there is an optionally provided divider or buffer stage 35 after the feedback line 30 back to the input line 11.

To initiate oscillation, enable switch 20 is operatively on and an oscillating waveform is produced at output Vout 40. Essentially, RO circuit 10 converts an input signal Vin 11 into an alternating signal using an odd number of inverter stages that provides a feedback such that the output Vout 40 oscillates between two voltage levels, e.g., 1 and 0, at a desired frequency. The number of inverter stages and the delay time of each stage dictates the operating frequency of the oscillating waveform generated at the RO 10.

As shown in FIG. 2, in the conventional design, over time, the inverter transistor gates, e.g., gates 12, are subject to both BTI and HCI effects 29 while time dependent dielectric breakdown (TDDB) could be decoupled by other methodologies.

Current techniques to measure BTI and HCI effects as failure mechanisms in ring oscillator circuit designs involve applying a stress, e.g., applying a power rail voltage, to a ring oscillator and letting the RO run for a period of time and at certain temperatures and measuring a voltage output frequency and particularly a frequency shift at the output over time. For example, FIG. 1A shows a plot of a percent frequency shift (Y-axis) as a function of stress time (X-axis) for a large multi-stage ring oscillator which is representative of a low frequency RO, and FIG. 1B shows a plot of a percent frequency shift (Y-axis) as a function of stress time (X-axis) for an example smaller multi-stage ring oscillator which is representative of a high frequency RO.

As shown in FIGS. 1A and 1B, in both low frequency and high frequency scenarios, the measured frequency shift tends to increase over time. This is representative of a time slope "n" which becomes steeper with longer stress time. Both the low temperature and high frequency condition in the plot of FIG. 1B exemplify this behavior.

Different RO circuit reactions represented as the different slopes "n" of the plots depicting frequency shifts as functions of stress times and temperatures can be used to separate BTI and HCI effects as failure mechanisms in ring oscillators circuits. For example, in FIG. 1A, BTI effects tend to dominate in larger stage RO (low frequency), while in FIG. 1B, HCI effects tend to dominate in smaller stage RO (higher frequency).

However, current techniques require different length stages and require long stress times. To accurately discern failure mechanisms due to HCI effects, there is required extremely high frequencies (extremely small stages) whereas to accurately discern failure mechanisms due to BTI effects typically require larger stages (e.g., BTI effect typically require RO having millions of stages).

Further it is hard to separate failure mechanisms if inverter stages are too close or due to possible process caused modeling parameter shifts.

The present application provides a ring oscillator design for decoupling the effects of BTI and HCI.

Figure 3:
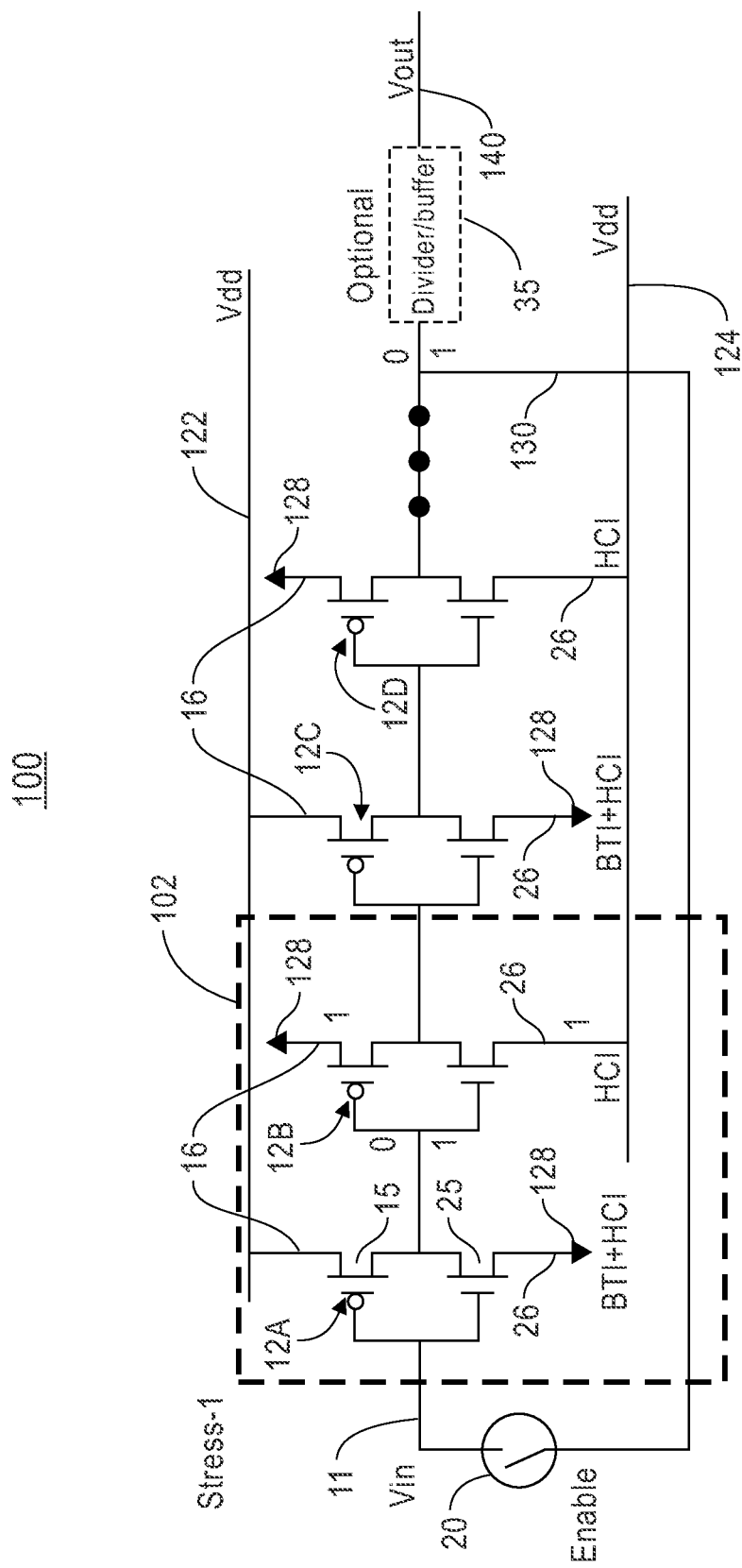
FIG. 3 depicts a first RO circuit design with alternate power rail connections for functional inverters for applying a first stress condition according to a first embodiment.

In a first RO design shown in FIG. 3, a ring oscillator (RO) circuit 100 includes the chain of multiple serial connected inverter devices, e.g., CMOS NAND gates including a connected PMOS FET 15 and NMOS FET device 25 having a common gate input receiving a voltage output produced from a prior stage and having common connected drain terminal outputs. In embodiments, the inverter stage devices, e.g., gates, can include planar FETs, FinFETs, nanosheet (NS) FETs, VFETs, stacked FET, etc. The input to the RO circuit 100 is a voltage input Vin and the output of a last stage is fed back via voltage feedback line 130 to the input line 11, e.g., through an enable switch 20. Vout is an output signal 140 that oscillates between two voltage levels. at a frequency determined by the delay of each inverter and the number of inverter stages. However, in this first RO circuit 100, each inverter stage includes a coupling 102 of two or more adjacent serially connected inverter devices. For example, the first stage includes a first inverter device 12A and a second inverter device 12B although more serially connected inverter devices may be included. Similarly, the next inverter stage includes a coupling of two or more serially connected inverter devices 12C, 12D, and so on.

In this first RO circuit 100, there are provided two power rails for applying a first stress condition. That is, the RO circuit 100 of FIG. 3 includes a first power rail 122 sourcing a first Vdd and second power rail 124 sourcing a second Vdd. First Vdd power rail 122 is shown connecting to source terminals 16 of the PMOS device 15 at each of first alternating stages, i.e., at gate inverter stages 12A, 12C, etc. while source terminals 16 of the coupled PMOS devices at each of second alternating stages 12B, 12D, etc. of the serial connection are shown connected to a ground or negative voltage potential 128 or current sink.

Similarly, in this first RO circuit 100, a second Vdd power rail 124 is shown connecting to source terminals 26 of the NMOS device at each of the second alternating inverter stages, e.g., CMOS NAND gate inverter stages 12B, 12D, etc. while source terminals 26 of the coupled NMOS devices at each of the first alternating stages 12A, 12C, etc. of the serial connections are shown connected to a ground or negative voltage potential 128 or current sink. In all embodiments of the RO circuits described herein, all applied power rail Vdd voltages can range anywhere between 0.5-7.0 volts and two power rails in a RO circuit can be the same or different value during a stress condition (i.e., could be the same or 1×~5× operation voltage).

As shown in the first RO circuit 100, when stressed over time under this first stress condition ("stress 1") using two power rails 122, 124, the first alternative stages 12A, 12C, . . . , etc. exhibit a BTI/HCI failure mechanism effect and second alternating stages 12B, 12D, etc. are shown in FIG. 3 to exhibit a dominant HCI failure mechanism effect over time and designed to extract HCI portion by combining with a typical stress $\Delta f_2$. This is based upon a change in the output frequency measurement $\Delta f_1$ of first RO circuit 100 over time resulting from a corresponding "BTI&HCI+HCI" mode stress.

Figure 4:
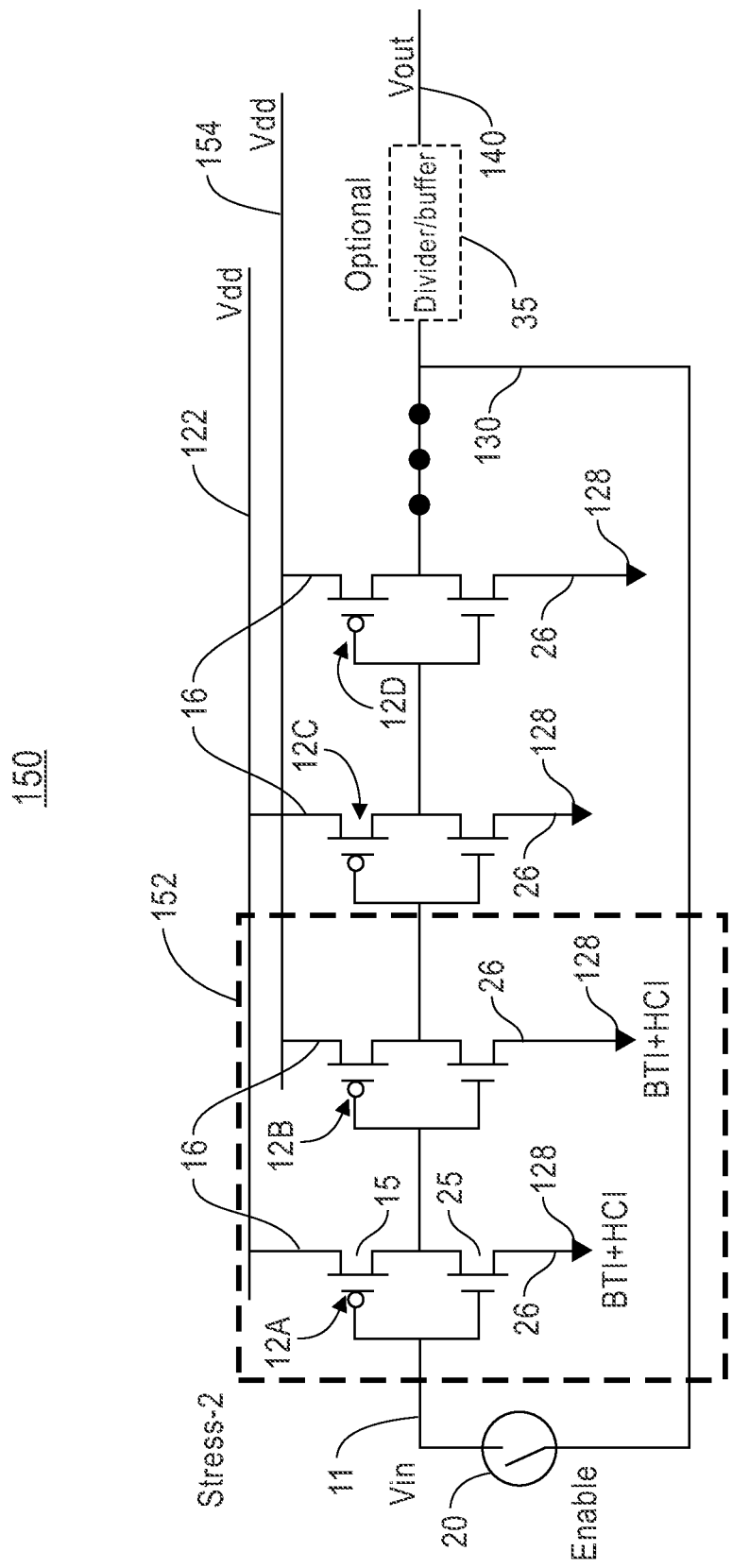
FIG. 4 depicts a first alternative RO circuit design with alternate power rail connections for functional inverters for applying a second stress condition according to a second embodiment.

Similarly, in an alternative RO circuit design shown in FIG. 4, a ring oscillator (RO) circuit 150 includes the chain of multiple serial connected inverter devices, each inverter device including, for example, CMOS NAND gates including a connected PMOS FET 15 and NMOS FET device 25 having a common gate input receiving a voltage output produced from a prior stage and having common connected drain terminal outputs. The input to the RO circuit 150 is a voltage line 11 sourcing an input voltage Vin and the output of a last stage is fed back via voltage feedback line 130 to the input 11, e.g., through an enable switch 20. Vout is an output signal 140 that oscillates between two voltage levels. at a frequency determined by the delay of each inverter and the number of inverter stages. However, in this second RO circuit 150, each inverter stage includes a coupling 152 of two or more adjacent serially connected inverter devices. For example, the first stage includes a first inverter device 12A and a second inverter device 12B, although additional serial connected inverter devices may be included. Similarly, the next inverter stage includes a coupling of two serially connected inverter devices 12C, 12D, and so on.

Further, in this alternative RO circuit 150, there are provided two power rails for applying a second stress condition. That is, the RO circuit 150 of FIG. 4 includes a first power rail 122 sourcing Vdd and a second power rail 154 sourcing Vdd. First Vdd power rail 122 is shown connecting to source terminals 16 of the PMOS device at each of first alternating stages, e.g., CMOS gate inverter devices 12A, 12C, etc. while source terminals 16 of the coupled PMOS devices at each of second alternating devices 12B, 12D, etc. of the serial connection are shown connected to the second Vdd power rail 154.

In this second RO circuit 150, connected to source terminals 26 of the NMOS device at each of serial connected inverter stages, e.g., CMOS gate devices 12A, 12B, 12C, etc. is a ground or negative voltage potential 128 or current sink.

As shown in the second RO circuit 150 of FIG. 4, when stressed over single or multiple time durations under this second stress condition ("stress 2") using two power rails 122, 154, each stage 12A, 12B, 12C, etc. is shown to exhibit a coupled BTI+HCI failure mechanism effect over time, i.e., a "BTI&HCI" mode stress. That is, it is difficult to decouple HCI vs. BTI failure mechanism based on an output detected frequency shift $\Delta f_2$ over time at the second RO circuit 150.

Figure 5:
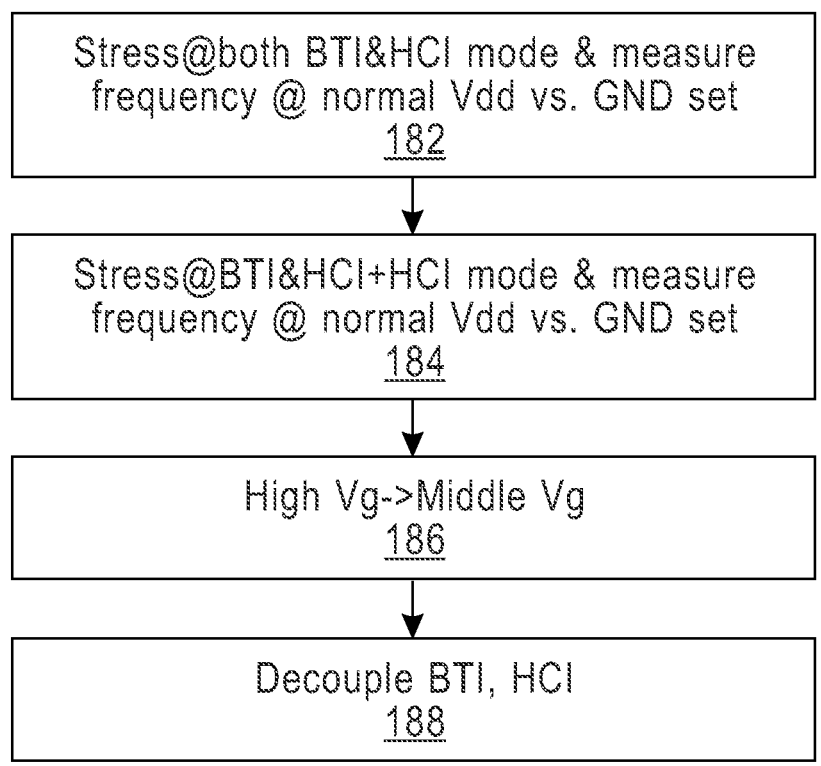
FIG. 5 depicts a first method for decoupling the HCI versus BTI failure mechanism effects using the first RO circuit of FIG. 3 and alternative RO circuit design of FIG. 4.

FIG. 5 depicts a method 180 for decoupling the HCI versus BTI failure mechanism effects using the frequency shift resulting from stresses applied to first RO circuit 100 of FIG. 3 and second RO circuit 150 of FIG. 4. As depicted at first step 182, there is applied the "BTI&HCI" stress condition over a period of time at the second RO circuit 150 of FIG. 4. In an embodiment, there are multiple stress times applied to the RO that can vary in length from multiple seconds to multiple hours (e.g., 0.1 μsec to 100000 sec). After each applied stress there is a corresponding measurement taken which are used to determine a frequency shift. That is, after applying the respective Vdd and ground conditions to the second RO circuit 150 that corresponds to the second stress condition, i.e., a "BTI&HCI" mode stress, for each stress time duration, there is then measured a change in the output signal oscillating frequency $\Delta f_2$.

Similarly, at a second step 184, there is applied the "BTI&HCI+HCI" stress condition over multiple periods of time at different time durations at the first RO circuit 100 of FIG. 3. In an embodiment, there are multiple stress times applied to the RO that can vary in length from multiple seconds to multiple hours. After each applied stress there is a corresponding measurement taken which are used to determine a frequency shift. That is, after applying the respective two Vdd power rails and ground conditions to the first RO circuit 100 that corresponds to the first stress condition, i.e., a BTI&HCI+HCI mode stress, for each stress time duration, there is measured a change in the output signal oscillating frequency $\Delta f_1$.

Then, at 186, the first and second stress conditions applied to the respective RO circuits 100, 150 for the multiple time durations are repeated, however with inverter stage PMOS and NMOS devices at alternating stages 12B, 12D, etc. configured at a different applied gate voltage Vg, i.e., a "mid Vg" gate voltage when subject to the stress-2 condition (FIG. 4). That is, while applying initial stresses to RO circuits 100, 150 for the multiple time durations, the PMOS and NMOS devices at each of the alternating inverter stages 12B, 12D, etc. are initially configured at a high Vg condition when stressed in stress-1 condition (FIG. 3). That is, the first and second stress conditions applied to respective alternative RO circuit designs are applied with the PMOS and NMOS devices at each of the alternating inverter stages 12B, 12D, etc. configured at a different applied gate voltage Vg, i.e., a mid-Vg. In this manner, different frequency shift results are obtained which can be used in subsequent BTI/HCI decoupling computations in step 186 from the correlation shown in the plots of FIG. 6 achieved from a device under test (DUT).

Figure 6:
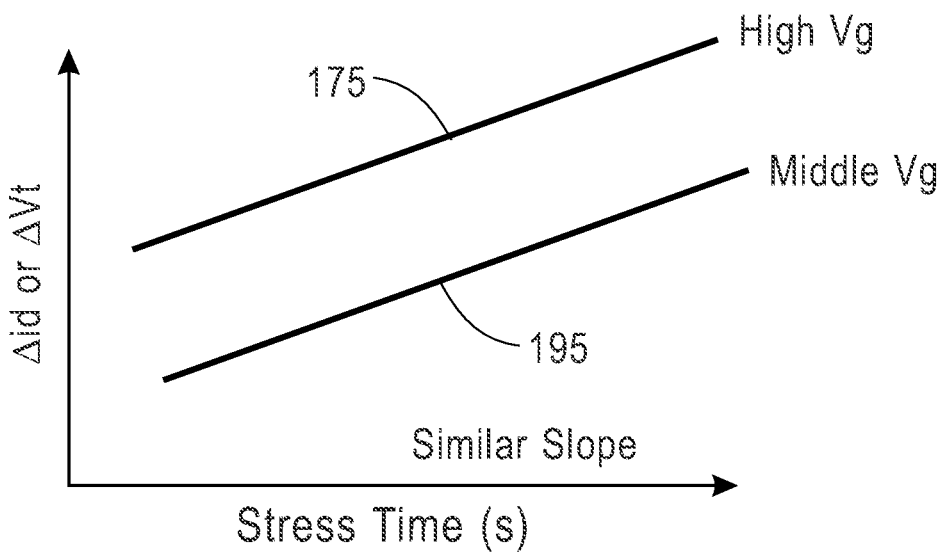
FIG. 6 shows an energy driven hot-carrier model that can be used to correlate between high Vg and middle Vg stress conditions.

In a non-limiting embodiment, and for exemplary, non-limiting purposes, the following formula is used to relate the BTI&HCI+HCI mode stress 1 condition to the measurement $\Delta f_1$:

$$\Delta f_1 = a \times \Delta f(BTI) + b \times \Delta f(HCI-MiddleVg) + c \times \Delta f(HCI-highVg)$$

where "a" is a BTI weight factor, "b" is a middle Vg HCI weight factor and "c" is a high Vg weight factor. For example, FIG. 6 shows an energy driven hot-carrier model that can be used to measure changes in frequency at certain advanced nodes at certain Vd/Vg ratio conditions. In a non-limiting, exemplary embodiment, a high Vg corresponds to a plot 175 based upon a first Vd/Vg ratio, e.g., where Vd=Vg, and a mid Vg corresponds to a plot 195 based upon a second Vd/Vg ratio, e.g., where Vd>Vg and the difference results in a translation with the respective slopes of plot 175, 195 remaining the same.

Further, in a non-limiting embodiment, and for exemplary, non-limiting purposes, the following formula is used to relate the BTI&HCI mode stress 2 condition to the measurement $\Delta f_2$:

$$\Delta f_2 = a \times \Delta f(BTI) + b \times \Delta f(HCI-MiddleVg) + a \times \Delta f(BTI) + b \times \Delta f(HCI-MiddleVg)$$

Returning to FIG. 5, at 188, the effects of BTI and HCI can be decoupled in view of the differences between $\Delta f_1$ and $\Delta f_2$. That is, the computing $\Delta f$ according to:

$$\Delta f = 2 \times \Delta f_1 - \Delta f_2$$

results in $\Delta f = 2c \times \Delta f(HCI-highVg)$ which is a measure attributable to the HCI failure mechanism effect.

Figure 7:
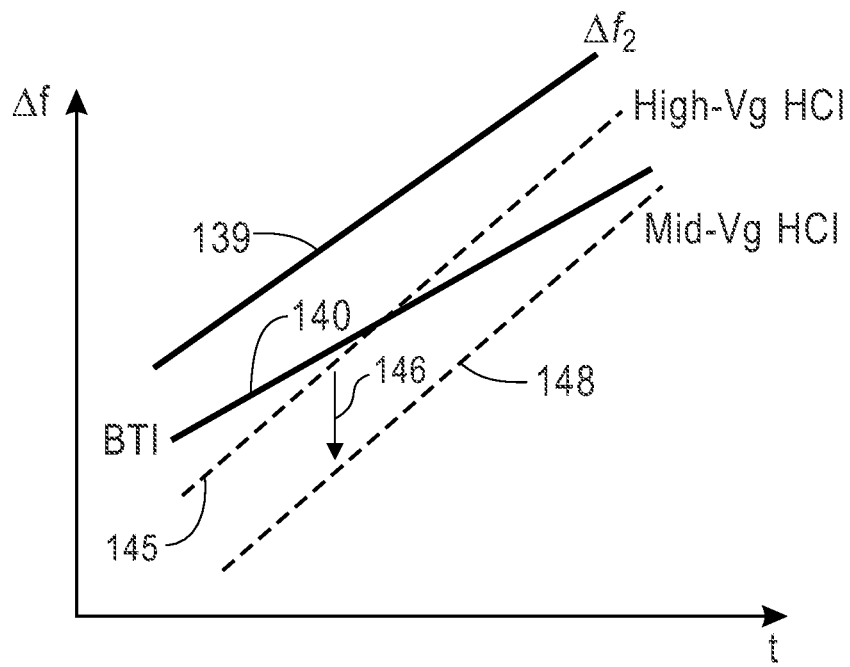
FIG. 7 depicts a plot of computed Δf values (Y-axis) versus stress time (X-axis) for use in decoupling failure mechanisms due to HCI and BTI failure mechanism effects when the RO is stressed according to the method of FIG. 5.

FIG. 7 depicts a plot of computed $\Delta f$ values (Y-axis) versus stress time (X-axis) for use in decoupling failure mechanisms due to HCI and BTI failure mechanism effects when the RO is stressed according to the method of FIG. 5. Additionally shown for comparison is the initial plot 139 of the $\Delta f_2$ results which relates to frequency shift results of the coupled BTI&HCI mode stress condition only. In FIG. 7, it is seen that BTI failure mechanism effect 140 over time is coupled to the HCI failure mechanism effect over time 145 under a "high" gate voltage (Vg) condition. High-Vg HCI is also plotted with measurement results $\Delta f = 2 \times \Delta f_1 - \Delta f_2$, and a further transfer from high-Vg HCI to mid-Vg HCI is plotted as 146 based on relation from FIG. 6. BTI is plotted by $\Delta f_2$ subtracting impact from Mid-Vg HCI 148. Based on the plots shown in FIG. 7, it is determined which mechanism dominates RO failure, e.g., as FIG. 7 demonstrates, Mid-Vg HCI caused frequency change is lower than BTI at earlier stress time, which means BTI dominates during some time range.

In a further embodiment, the first ring oscillator circuit of FIG. 3 (design 1) and second ring oscillator circuit of FIG. 4 (design 2) could be the same, i.e., RO circuit design 1 could be aligned to RO circuit design 2, and a stress applied to the first ring oscillator circuit and at the second ring oscillator circuit can be different (e.g., with just a test condition change) when measuring the respective first frequency $\Delta f_1$ and second frequency $\Delta f_2$.

Figure 8:
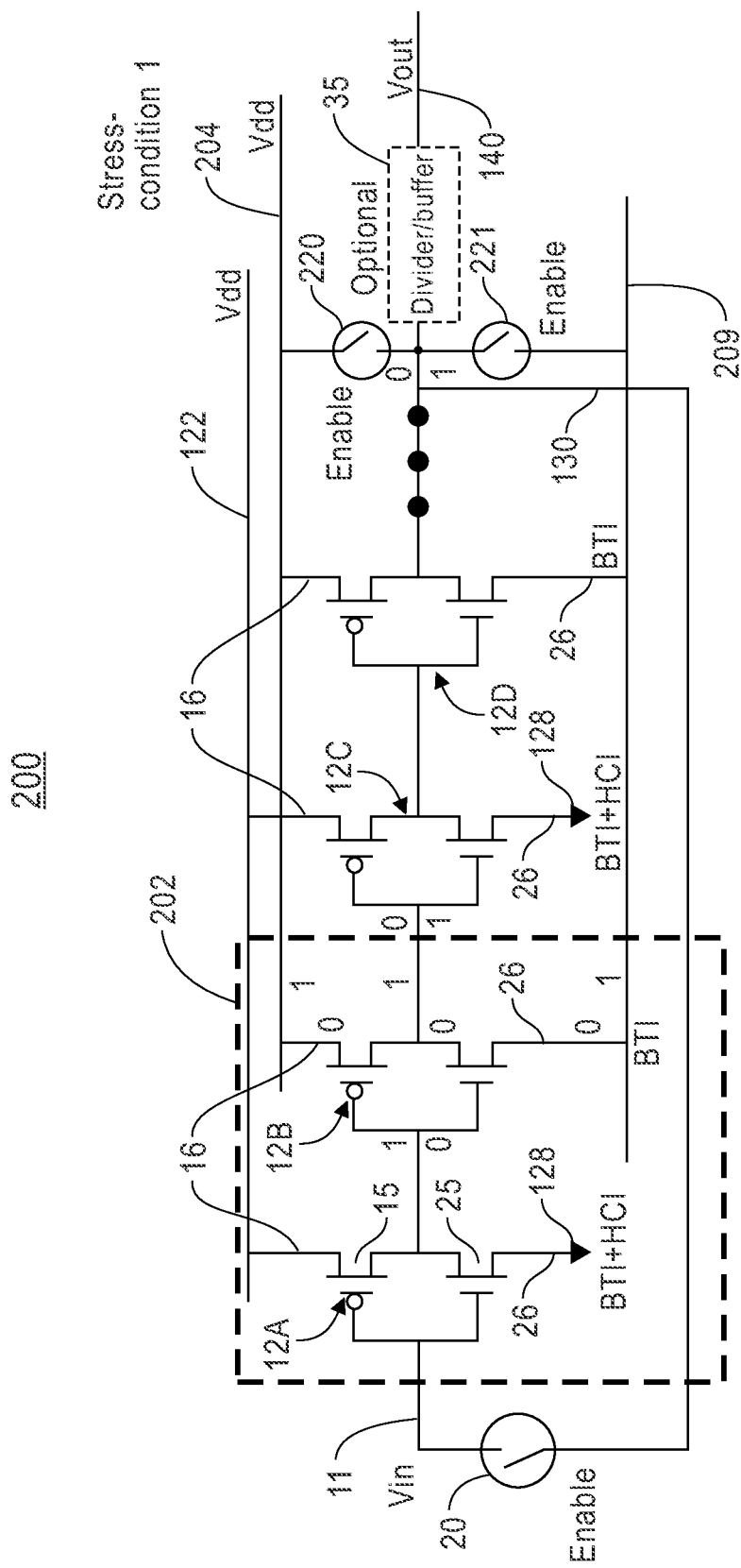
FIG. 8 depicts a further modified RO circuit design with alternate power rail connections for functional inverters for applying a stress condition according to a further embodiment.

In a further embodiment, an alternative RO circuit design shown in FIG. 8, a ring oscillator (RO) circuit 200 includes the chain of multiple serial connected inverter devices, each inverter device including, for example, CMOS gates including a connected PMOS FET 15 and NMOS FET device 25 having a common gate input receiving a voltage output produced from a prior stage and having a common connected drain terminal outputs as shown in FIG. 8. The input to the alternative RO circuit is a voltage line input Vin 11 and the output of a last stage is fed back via voltage feedback line 130 to the input, e.g., through an enable switch 20. Vout is an output signal 140 that oscillates between two voltage levels. at a frequency determined by the delay of each inverter and the number of inverter stages. However, in this further alternative RO circuit 200, each inverter stage includes a coupling 202 of two or more adjacent serially connected stages. For example, the first stage includes a first inverter device 12A and a second inverter device 12B although more devices can be included. Similarly, the next inverter stage includes a coupling of two or more serially connected inverter devices 12C, 12D, and so on.

Further, in this alternative RO circuit 200, there is provided a power rail 122 for applying a Vdd voltage during a stress condition. Power rail 122 is shown connecting to source terminals 16 of the PMOS device at a first inverter device at each of first alternating stages, e.g., CMOS gate inverter stages 12A, 12C, etc. Further in this RO circuit 200, shown connecting to source terminals 26 of the NMOS device at each of first alternating stages, e.g., CMOS NAND gate inverter stages 12A, 12C, etc. is a ground or negative voltage connection or current sink 128.

In the alternative RO circuit 200, there is provided two floating conductor lines 204, and 209. Floating conductor line 204 connects to source terminals 16 of each PMOS device of the second alternating inverter stages, e.g., CMOS NAND gate inverter stages 12B, 12D, etc. Floating line 204 further connects to the output signal line 140 providing Vout via a first enable switch 220. Similarly, in the alternative RO circuit 200, floating conductor line 209 connects to source terminals 26 of each NMOS device of the second alternating inverter stages, e.g., CMOS gate inverter stages 12B, 12D, etc. Floating line 209 further connects to the output signal line 140 providing Vout via a second enable switch 221. Prior to enabling (on) switches 220, 221, no stimulus is being applied to second alternating inverter stages 12B, 12D, etc.

During a stress condition, the switches 220, 221 are enabled to conduct in an on state. Consequently, the oscillating Vout output signal 140 becomes applied to the source terminals 16 of each PMOS device of the second alternating inverter stages 12B, 12D, etc. via conductor line 204 and output signal 140 also becomes applied to source terminals 26 of each NMOS device of the second alternating inverter stages 12B, 12D, etc. via conductor line 209.

As shown in the alternative RO circuit 200, when stressed over time under the stress condition using power rail 122 the devices of first alternative stages 12A, 12C, etc. exhibit a "BTI&HCI" failure mechanism effect. However, due to the application of the output signal Vout at the second alternating stages 12B, 12D, etc., via connections to conductors 204, 209, the inverter devices at these second alternating stages 12B, 12D, etc. are designed to extract BTI portion and are shown in FIG. 8 to exhibit a dominant BTI failure mechanism at these stages effect over time. This is based upon a change in the output frequency measurement $\Delta f_1$ of the alternative RO circuit 200 over time resulting from a corresponding "BTI&HCI+BTI" mode stress.

Figure 9:
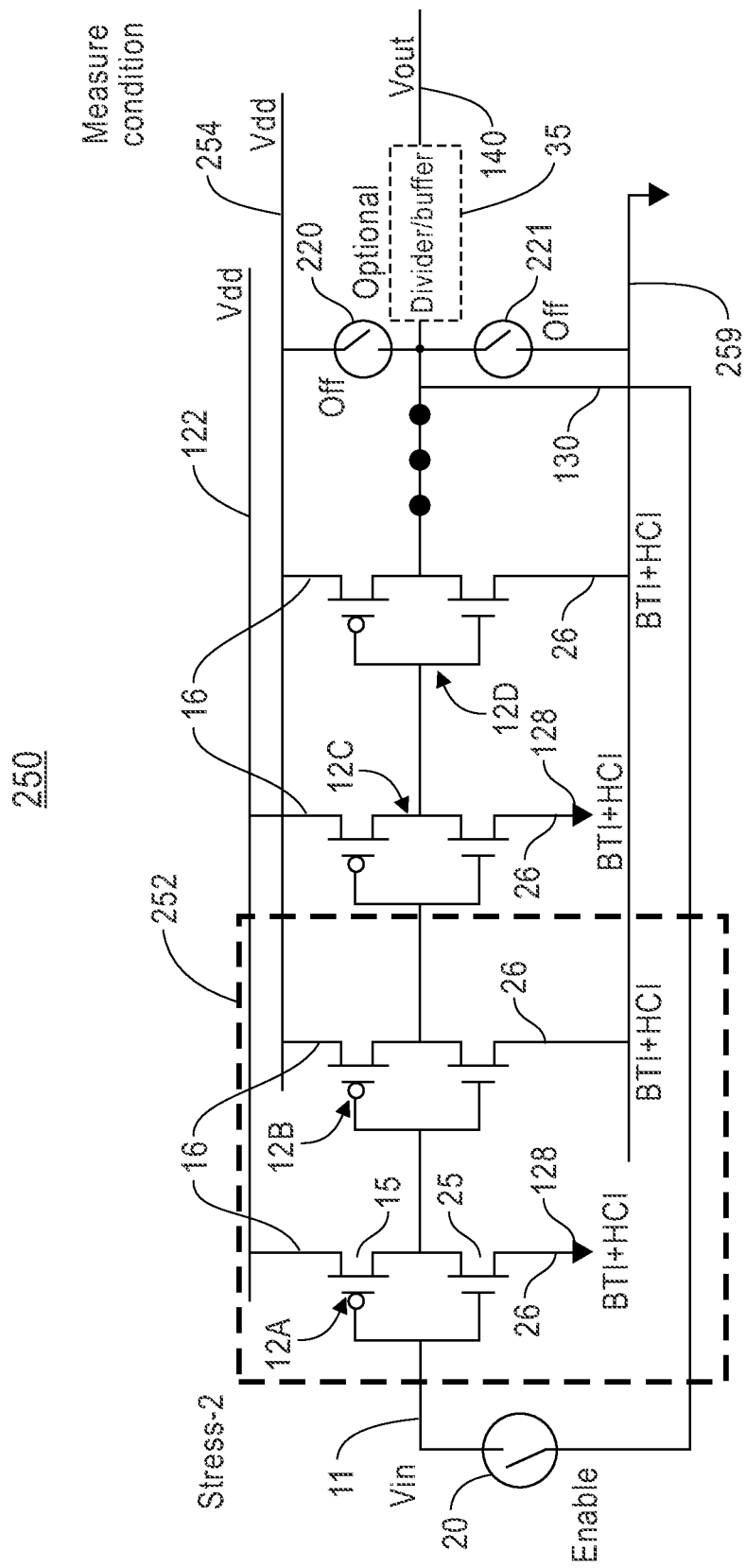
FIG. 9 depicts a further modified alternative RO circuit design corresponding to the RO circuit design of FIG. 8 and applicable to a measurement condition according to a further embodiment.

A further modified alternative RO circuit characterization condition 250 shown in FIG. 9 corresponds to the RO circuit design 200 of FIG. 8 however is applicable to a measurement condition. The ring oscillator (RO) circuit 250 of FIG. 9 includes the chain of multiple serial connected inverter devices, each inverter device including, for example, CMOS gates including a connected PMOS FET 15 and NMOS FET device 25 having a common gate input receiving a voltage output produced from a prior stage and having a common connected output drain terminals as shown in FIG. 9. The input to the RO circuit 250 is a voltage input Vin 11 and the output of a last stage is fed back via voltage feedback line 130 to the input line, e.g., through the enable switch 20. Vout is an output signal 140 that oscillates between two voltage levels at a frequency determined by the delay of each inverter device and the number of inverter stages. However, in this further modified alternative RO circuit 250, each inverter stage includes a coupling 252 of two or more adjacent serially connected inverter device stages. For example, the first stage includes a first inverter device 12A and a second inverter device 12B although more devices can be included. Similarly, the next inverter stage includes a coupling of two serially connected inverter device 12C, 12D, and so on.

This modified alternative RO circuit 250 of FIG. 9 corresponds to the RO circuit 200 of FIG. 8 and includes the first power rail 122 for applying a Vdd voltage during a measurement condition. First Vdd power rail 122 is shown connecting to source terminals 16 of the PMOS device 15 at each of first alternating stages, e.g., CMOS gate inverter devices 12A, 12C, etc. However, RO circuit 250 includes a further power rail conductor 254 that corresponds to the floating conductor line 204 in the RO circuit of FIG. 8. That is, with enable switch 220 in an "Off" (open) state, during a measurement condition, this conductor line 254 is configured to apply a Vdd voltage during the measurement condition. This further power rail 254 is connected to source terminals 16 of the respective coupled PMOS devices at each of the second alternating stages 12B, 12D, etc. of the RO circuit serial connection.

Further, in this modified alternative RO circuit 250, there is further included a ground or negative voltage connection 128 to a source terminal 26 of the NMOS device 25 at the inverter device of each of the first alternating stages, e.g., CMOS gate inverter stages 12A, 12C, etc. RO circuit 250 of FIG. 9 further includes a ground or negative voltage rail conductor 259 that corresponds to the floating conductor line 209 in the RO circuit of FIG. 8. That is, with enable switch 221 in an "Off" (open) state, during a measurement condition, this conductor line 259 is configured as a ground or negative voltage potential during the measurement condition. This ground or negative voltage potential 259 is connected to the source terminals 26 of the NMOS device 25 at each of the second alternating stages, e.g., CMOS gate inverter devices 12B, 12D, etc. During a measurement condition, these switches 220, 221 thus are both respectively controlled to be opened to provide power rail Vdd voltage to the connected source terminals 16 of the PMOS devices 15 of each second alternating stages 12B, 12D, etc., and provide a ground or negative voltage potential to the connected source terminals 26 of the NMOS devices 25 of each second alternating stages 12B, 12D, etc.

As shown in the modified alternative RO circuit 250 of FIG. 9, when stressed over time duration this measurement using two power rails 122, 254 at alternate inverter stages 12A, 12C, etc. and second alternate inverter stages 12B, 12D, etc. are shown to exhibit a coupled "BTI+HCI" failure mechanism effect over time, i.e., a "BTI&HCI" mode stress. That is, it is difficult to decouple HCI vs. BTI failure mechanism based on an output detected frequency shift $\Delta f_2$ over time at the RO circuit 250 of FIG. 9.

Figure 10:
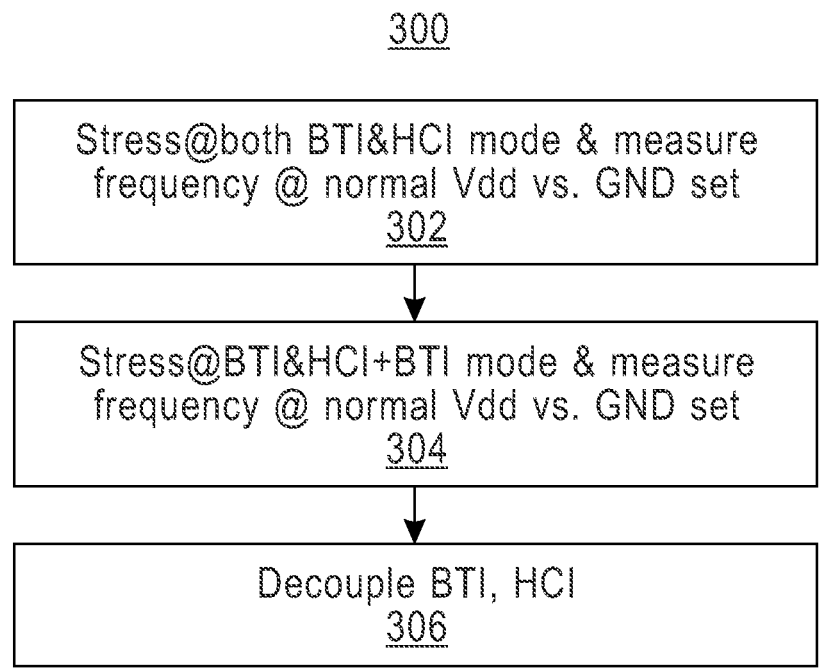
FIG. 10 depicts a further method for decoupling the HCI versus BTI failure mechanism effects using the alternative RO circuit of FIG. 8 and the further modified alternative RO circuit design of FIG. 9.

FIG. 10 depicts a method 300 for decoupling the HCI versus BTI failure mechanism effects using the frequency shifts resulting from stress condition applied to RO circuit 200 of FIG. 8 and the measurement condition applied at further RO circuit 250 of FIG. 9. As depicted at first step 302, there is applied the "BTI&HCI" stress condition over a period of time at the RO circuit 250 of FIG. 9. In an embodiment, there are multiple stress times applied to the RO that can vary in length from multiple micro-seconds to multiple hours. After each applied stress there is a corresponding measurement taken which are used to determine a frequency shift. For example, at the RO circuit 250 of FIG. 9, after applying the respective the Vdd supply 122 and ground or negative voltage conditions 128 to the inverter devices of the first alternating inverter stages 12A, 12C, etc. of RO circuit 250 and keeping switches 220, 221 open (off) to apply the second power rail Vdd voltage 254 and ground potential 259 to the source terminals of the respective PMOS and NMOS devices of each of the second alternating stages 12B, 12D, etc. of RO circuit 250 that corresponds to the "BTI&HCI" mode stress, for each stress time duration, there is measured a change in the output signal oscillating frequency $\Delta f_2$.

Similarly, at a second step 304, there is applied the "BTI&HCI+BTI" stress condition over multiple periods of time at different time durations at the first RO circuit 200 of FIG. 8. In an embodiment, there are multiple stress times applied to the RO that can vary in length from multiple seconds to multiple hours. After each applied stress there is a corresponding measurement taken which are used to determine a frequency shift. That is, after applying the power rail Vdd voltage to each of the source terminals of first alternating PMOS devices of inverter stages 12A, 12C, etc. and ground or negative voltage conditions 128 to the source terminals of NMOS inverter devices of each of the first alternating inverter stages 12A, 12C, etc. of RO circuit 250, and by enabling switches 220, 221 closed (on) to apply the RO output oscillating signal to source terminals of both PMOS and NMOS devices of each second alternating stages 12B, 12D, etc. of RO circuit 200 that corresponds to the "BTI&HCI+BTI" mode stress, for each stress time duration, there is measured a change in the output signal oscillating frequency $\Delta f_1$.

Then, at 306, FIG. 10, the effects of BTI and HCI can be decoupled in view of the differences between $\Delta f_1$ and $\Delta f_2$.

In a non-limiting embodiment, and for exemplary, non-limiting purposes, the following formula is used to relate the BTI&HCI+BTI mode stress condition to the measurement $\Delta f_1$:

$$\Delta f_1 = \alpha \times \Delta f(BTI) + b \times \Delta f(HCI) + \alpha \times \Delta f(BTI)$$

where "$\alpha$" is a BTI weight factor and "b" is a middle Vg HCI weight factor relating to results of the PMOS and NMOS devices under test stresses at each of the alternating inverter stages 12B, 12D, etc. as shown in FIG. 8.

Further, in a non-limiting embodiment, and for exemplary, non-limiting purposes, the following formula is used to relate the BTI&HCI mode stress condition to the measurement $\Delta f_2$:

$$\Delta f_2 = \alpha \times \Delta f(BTI) + b \times \Delta f(HCI) + \alpha \times \Delta f(BTI) + b \times \Delta f(HCI)$$

Then at FIG. 10, at 188, the effects of BTI and HCI are decoupled in view of the computing of the difference between $\Delta f_1$ and $\Delta f_2$. That is, the computing $\Delta f$ according to:

$$\Delta f = 2 \times \Delta f_1 - \Delta f_2$$

results in $\Delta f = 2\alpha \times \Delta f(BTI)$ which is a measure attributable to the BTI failure mechanism effect.

Figure 11:
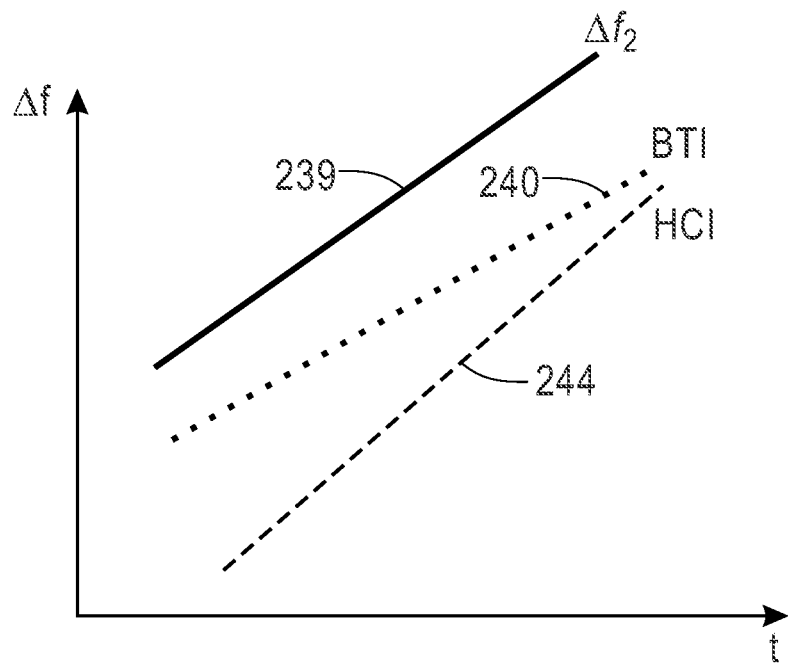
FIG. 11 depicts a plot of the computed Δf values (Y-axis) versus stress time (X-axis) for use in decoupling failure mechanisms due to HCI and BTI failure mechanism effects when the RO is stressed according to the method of FIG. 10.

FIG. 11 depicts a plot of the computed $\Delta f$ values (Y-axis) versus stress time (X-axis) for use in decoupling failure mechanisms due to HCI and BTI failure mechanism effects when the RO is stressed according to the method of FIG. 10.

In FIG. 11, it is seen initially that BTI failure mechanism effect 240 over time is decoupled from the HCI failure mechanism effect 244 over the same time period. Additionally shown for comparison is the initial plot 239 of the $\Delta f_2$ results which relates to frequency shift results of the coupled BTI&HCI mode stress condition only.

In a further embodiment, the first ring oscillator circuit of FIG. 8 (design 1) and second ring oscillator circuit of FIG. 9 (design 2) could be the same, i.e., RO circuit design 1 could be aligned to RO circuit design 2, and a stress applied to the first ring oscillator circuit and at the second ring oscillator circuit can be different (e.g., with just a test condition change) when measuring the respective first frequency Afi and second frequency $\Delta f_2$.

Based on the circuit design and methodology to decouple BTI/HCI for RO according to embodiments herein, there is improved prediction of which mechanism would be a key dominate for future circuit design and process improvement, which is important for Design Technology Co-Optimization. For example, prediction of BTI effects can lead to better process improvement while prediction of HCI effects and be used to improve NMOS or PMOS device junction profiles and impurity implantations, etc.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A ring oscillator circuit comprising:
   three or more inverter stages connected in series, wherein each inverter stage includes one or more inverter devices, each inverter device comprising a PMOS FET device (PMOS) and a coupled NMOS FET device (NMOS), the PMOS device and the coupled NMOS device in each of first alternating inverter devices of the three or more inverter stages having a source terminal, and wherein a source terminal of the coupled NMOS device in each of first alternating inverter devices of the three or more inverter stages is grounded when the source terminal at the PMOS device in each the first alternating inverter devices is connected to receive voltage from a first power rail conductor; and
   the PMOS device in each of the second alternating inverter devices of the three or more inverters having a source terminal that is: grounded when the source terminal at the PMOS device in each of the first alternating inverter devices is connected to receive voltage from the first power rail conductor and the source terminal of the NMOS device of each of the second alternating inverter devices is connected to receive voltage from a second power rail conductor at a same or a relative different voltage level than the voltage level at the first power rail conductor, or
   the PMOS device in each of the second alternating inverter devices is connected to a third power rail conductor to receive voltage at a same or a relative different voltage level than a voltage level at the source terminal of each of first alternating inverter devices when the source terminal at the PMOS device in each of the first alternating inverter devices is connected to the first power rail conductor and the source terminal of the NMOS device in each of the second alternating inverter devices is one of: grounded or connected to the second power rail conductor to receive voltage at a same or a relative different voltage level than the voltage level at the third power rail conductor; and
   an output of a last inverter device of a last stage of the three or more inverter stages in series is connected to an input of a first inverter stage of the three or more inverter stages in series.

2. The ring oscillator circuit of claim 1, wherein each inverter stage comprises two or more serially connected inverter devices.

3. The ring oscillator of claim 1, wherein a source terminal of each PMOS device of each of said second alternating inverter devices of the three or more inverter stages connects to the output of the last inverter device of the last stage of the three or more inverter stages, and wherein a source terminal of each NMOS device of each of said second alternating inverter devices of the three or more inverter stages connects to the output of the last inverter device of the last stage of the three or more inverter stages.

4. The ring oscillator of claim 3, further comprising:
   a first switch connecting the output of the last inverter device of the last stage of the three or more inverter stages to the source terminal of each PMOS device of each of said second alternating inverter devices of the three or more inverter stages; and
   a second switch connecting the output of the last inverter device of the last stage of the three or more inverter stages to the source terminal of each NMOS device of each of said second alternating inverter devices of the three or more inverter stages.

5. A ring oscillator circuit comprising:
   three or more inverter stages connected in series, wherein each inverter stage includes one or more inverter devices, each inverter device comprising a PMOS FET device (PMOS) and a coupled NMOS FET device (NMOS), the PMOS device in each of first alternating inverter devices of the three or more inverter stages having a source terminal configured to receive voltage from a power rail conductor, and wherein a source terminal of the coupled NMOS device in each of first alternating inverter devices of the three or more inverter stages is grounded or at a relative different voltage level than a voltage level at the power rail conductor;
   an output of a last inverter device of a last stage of the three or more inverter stages in series is connected to an input of a first inverter stage of the three or more inverter stages in series;
   a first conductor line;
   a first switch operable for conducting the output of the last inverter device of the last stage of the three or more inverter stages to said first conductor line, wherein a source terminal of each PMOS device of each of second alternating inverter devices of the three of more inverter stages is connected to the first conductor line;
   a second conductor line; and
   a second switch operable for conducting the output of the last inverter device of the last stage of the three or more inverter stages to said second conductor line, wherein a source terminal of each NMOS device of each of second alternating inverter devices of the three of more inverter stages is connected to the second conductor line.

6. The ring oscillator of claim 5, wherein said first switch is further operable for conducting voltage from the power rail conductor to each source terminal of each PMOS device of each of second alternating inverter devices of the three of more inverter stages via said first conductor line.

7. The ring oscillator of claim 6, wherein said second switch is further operable for conducting a ground or negative voltage to each source terminal of each NMOS device of each of second alternating inverter devices of the three of more inverter stages via said second conductor line.

8. The ring oscillator of claim 5, wherein each inverter stage comprises two or more serially connected inverter devices.

9. A method comprising:
   measuring a first frequency of a first ring oscillator circuit;
   measuring a second frequency of a second ring oscillator circuit, the second ring oscillator circuit comprising: three or more inverter stages connected in series, wherein each inverter stage includes one or more inverter devices, each inverter device comprising a PMOS FET device (PMOS) and a coupled NMOS FET device (NMOS), the PMOS device in each of inverter devices of the three or more inverter stages having a source terminal configured to receive voltage from a power rail conductor, and wherein a source terminal of the coupled NMOS device in each of the inverter devices of the three or more inverter stages is one of: grounded or at a relative different voltage level than a voltage level of the PMOS power rail conductor; and an output of a last inverter device of a last stage of the three or more inverter stages in series is connected to an input of a first inverter stage of the three or more inverter stages in series;
   determining a dominant failure mechanism of the first ring oscillator circuit based on the measured first frequency and the measured second frequency.

10. The method of claim 9, wherein the dominant failure mechanism is selected from the group consisting of: bias temperature instability (BTI) and hot carrier injection (HCI).

11. The method of claim 9, wherein the first ring oscillator circuit and second ring oscillator circuit are the same and a stress applied to the first ring oscillator circuit and the second ring oscillator circuit each different when measuring the respective first frequency and second frequency.

12. The method of claim 9, wherein the first ring oscillator circuit comprises:
   three or more inverter stages connected in series, wherein each inverter stage includes one or more inverter devices, each inverter device comprising a PMOS FET device (PMOS) and a coupled NMOS FET device (NMOS), the source terminal of a PMOS device in each of first alternating inverter devices of the three or more inverter stages receiving voltage from a power rail conductor, and wherein a source terminal of the coupled NMOS device in each of the first alternating inverter devices of the three or more inverter stages is grounded or at a relative different voltage level than a voltage level at the power rail conductor; and
   the source terminal of a NMOS device in each of second alternating inverter devices of the three or more inverter stages receiving voltage or at a relative different voltage level than a voltage level at the source terminal of each of first alternating inverter devices, and a source terminal of the coupled PMOS device in each of the second alternating inverter devices of the three or more inverter stages is grounded or at a relative different voltage level than a voltage level at the source terminal of each of first alternating inverter devices; and
   an output of a last inverter device of a last stage of the three or more inverter stages in series is connected to an input of a first inverter stage of the three or more inverter stages in series.

13. The method of claim 12, further comprising:
   prior to said measuring the first frequency of the first ring oscillator circuit :
   applying a stress condition to said second ring oscillator circuit for one or more predetermined time durations; and
   prior to said measuring the first frequency of the first ring oscillator circuit :
   applying a stress condition to said first ring oscillator circuit for one or more predetermined time durations.

14. The method of claim 13, wherein said applying said stress condition to said first ring oscillator circuit comprises:
   configuring a PMOS and NMOS device at each said second alternating inverter devices of the three or more inverter stages at a first determined ratio of drain voltage to gate voltage, said method further comprising:
   configuring a PMOS and NMOS device at each said second alternating inverter devices of the three or more inverter stages at a second determined ratio of drain voltage to gate voltage, wherein said gate voltage at said second determined ratio is reduced relative to the gate voltage at said first determined ratio, and repeating said applying a stress condition to said first ring oscillator circuit for one or more predetermined time durations while said PMOS and NMOS devices at each said second alternating inverter devices are configured at the second determined ratio of drain voltage to gate voltage, and then measuring the first frequency of a ring oscillator circuit of the first ring oscillator circuit.

15. The method of claim 9, wherein the first ring oscillator circuit design is a ring oscillator circuit comprising:
   three or more inverter stages connected in series, wherein each inverter stage includes one or more inverter devices, each inverter device comprising a PMOS FET device (PMOS) and a coupled NMOS FET device (NMOS), the source terminal of a PMOS device in each of first alternating inverter devices of the three or more inverter stages receiving voltage from a power rail conductor, and wherein a source terminal of the coupled NMOS device in each of the first alternating inverter devices of the three or more inverter stages is grounded or at a relative different voltage level than a voltage level at the power rail conductor; and
   a source terminal of each PMOS device of each of said second alternating inverter devices of the three or more inverter stages connects to an output of the last inverter device of the last stage of the three or more inverter stages, and wherein a source terminal of each NMOS device of each of said second alternating inverter devices of the three or more inverter stages connects to the output of the last inverter device of the last stage of the three or more inverter stages; and
   an output of the last inverter device of the last stage of the three or more inverter stages in series is connected to an input of a first inverter stage of the three or more inverter stages in series.

16. The method of claim 15, wherein the ring oscillator circuit of the first ring oscillator circuit design further comprises:
   a first switch connecting the output of the last inverter device of the last stage of the three or more inverter stages to the source terminal of each PMOS device of each of said second alternating inverter devices of the three or more inverter stages; and a second switch connecting the output of the last inverter device of the last stage of the three or more inverter stages to the source terminal of each NMOS device of each of said second alternating inverter devices of the three or more inverter stages.

17. The method of claim 16, wherein prior to said measuring a first frequency of a ring oscillator circuit of the first design comprises:

applying a stress condition to said first ring oscillator circuit for one or more predetermined time durations, said applying comprising:

enabling said first switch and said second switch to connect the output of the last inverter device of the last stage of the three or more inverter stages to the source terminals of each PMOS device and the source terminals of each NMOS device of each of said second alternating inverter devices.

18. The method of claim 17, wherein prior to said measuring a second frequency of a ring oscillator circuit of the second design comprises:

applying a stress condition to said second ring oscillator circuit for one or more predetermined time durations, said applying comprising:

disabling said first switch and conducting voltage from the power rail conductor to each source terminal of each PMOS device of each of second alternating inverter devices of the three of more inverter stages via a first conductor line; and disabling said second switch and conducting a ground potential to each source terminal of each NMOS device of each of second alternating inverter devices of the three of more inverter stages via a second conductor line.

\* \* \* \* \*